(12) United States Patent
Zander et al.

(10) Patent No.: US 6,329,588 B1
(45) Date of Patent: Dec. 11, 2001

(54) PHOTOVOLTAIC MODULES WITH COMPOSITE SHEETS

(75) Inventors: Klaus Zander, Mülheim; Hans Braun, Grevenbroich; Ulrich Fugger, Windeck; Lothar Schlegel, Radebeul, all of (DE)

(73) Assignee: Bayer Aktiengesellschaft, Leverkusen (DE)

( * ) Notice: Subject to any disclaimer, the term of this patent is extended or adjusted under 35 U.S.C. 154(b) by 0 days.

(21) Appl. No.: 09/647,386

(22) PCT Filed: Mar. 22, 1999

(86) PCT No.: PCT/EP99/01913

§ 371 Date: Oct. 30, 2000

§ 102(e) Date: Oct. 30, 2000

(87) PCT Pub. No.: WO99/52154

PCT Pub. Date: Oct. 14, 1999

(30) Foreign Application Priority Data

Apr. 1, 1998 (DE) .............................. 198 14 652

(51) Int. Cl.$^7$ ................................. H01L 31/048
(52) U.S. Cl. .................. 136/251; 136/256; 136/291; 136/244; 257/433; 257/434; 438/64; 438/66; 428/412; 428/421; 428/422; 428/424.4; 428/424.6; 428/74

(58) Field of Search ................. 136/251, 256, 136/291, 244; 257/433, 434; 438/64, 66; 428/412, 421, 422, 424.4, 424.6, 74

(56) References Cited

U.S. PATENT DOCUMENTS 5,650,019 * 7/1997 Yamada et al. ............... 136/251
5,728,230   3/1998 Komori et al. ............... 136/251

FOREIGN PATENT DOCUMENTS

4443317-A1 *  6/1996  (DE).
629004-A1  * 12/1994  (EP).
680 097     11/1995  (EP).
769818       4/1997  (EP).

OTHER PUBLICATIONS

English Abstract for JP 1–59201, Patent Abstracts of Japan, Mar.–1989.

* cited by examiner

Primary Examiner—Alan Diamond
(74) Attorney, Agent, or Firm—Joseph C. Gil; James R. Franks

(57) ABSTRACT

A photovoltaic module that contains one or more layers of a multi layered composite film is disclosed. The multilayered film contains at least one layer of polycarbonate and at least one layer of fluorine-containing polymer. The photovoltaic module of the invention features improved printability and mechanical properties.

16 Claims, 1 Drawing Sheet

PHOTOVOLTAIC MODULES WITH COMPOSITE SHEETS

CROSS REFERENCE TO RELATED PATENT APPLICATIONS

The present patent application claims the right of priority under 35 U.S.C. 119 and 35 U.S.C. 365 of International Application No. PCT/EP99/01913, filed Mar. 22, 1999, which was published in German as International Patent Publication No. WO 99/52154 on Oct. 14, 1999, which is entitled to the right of priority of German Patent Application No. 198 14, 652.3, filed Apr. 1, 1998.

FIELD OF THE INVENTION

The present invention relates to photovoltaic modules which contain one or more layers of a multilayered composite film and their use for producing electricity in stationary and mobile situations.

BACKGROUND OF THE INVENTION

Glass is used almost exclusively as a covering for rigid photovoltaic modules. Coverings made of glass are characterised by low mechanical strength.

Coverings of transparent plastics instead of glass have been disclosed. They consist mainly of polycarbonate sheets. They are used when a higher mechanical strength is required as is the case for example on sailing ships. Here the modules are used in the deck structures so that it cannot be excluded, for instance, that the modules may be trodden on. Modules with polycarbonate as a covering have the disadvantage that they are not very weather resistant. In addition they are permeable to water vapour so the photovoltaic modules can corrode. This means that these modules have to be replaced after a relatively short time.

The use of fluorinated polymers as transparent covering films in lightweight, flexible photovoltaic modules has already been disclosed. Here, either pure fluorinated polymers such as e.g. polyvinyl fluoride (PVF), or modified fluorinated polymers such as ethylene/tetrafluoroethylene copolymers (ETFE), are used. Tedlar® or Tefzel®, both commercial products from the DuPont Co., are used as films for the purpose mentioned above.

Three-layered films with the sequential structure polyvinyl fluoride/polyester/polyvinyl fluoride are also used as backing films for photovoltaic modules. An example of these is Icosolar®, a commercial product from the Isovolta Co.

Photovoltaic modules with coverings made from fluorinated polymer films have low mechanical strength. Also, it is difficult to print on fluorinated polymer films.

SUMMARY OF INVENTION

The present invention is based on the problem of providing photovoltaic modules with improved properties. In the first instance, the printability should be improved, as compared with photovoltaic modules made with fluorinated polymers. In addition, the mechanical strength should be improved. Compared with photovoltaic modules with glass coverings, weight should be saved and the resistance to breakage increased. Compared with photovoltaic modules with polycarbonate as covering, the weather resistance, impermeability to water vapour and scratch resistance should be improved. The low thermal stability of photovoltaic modules with fluorinated polymers as covering should be raised.

The object according to the invention is achieved by photovoltaic modules which are characterised in that they contain one or more layers consisting of a multilayered composite film which contains at least one layer of polycarbonate and at least one layer of a fluorine-containing polymer.

DETAILED DESCRIPTION OF THE INVENTION

Figure 1:
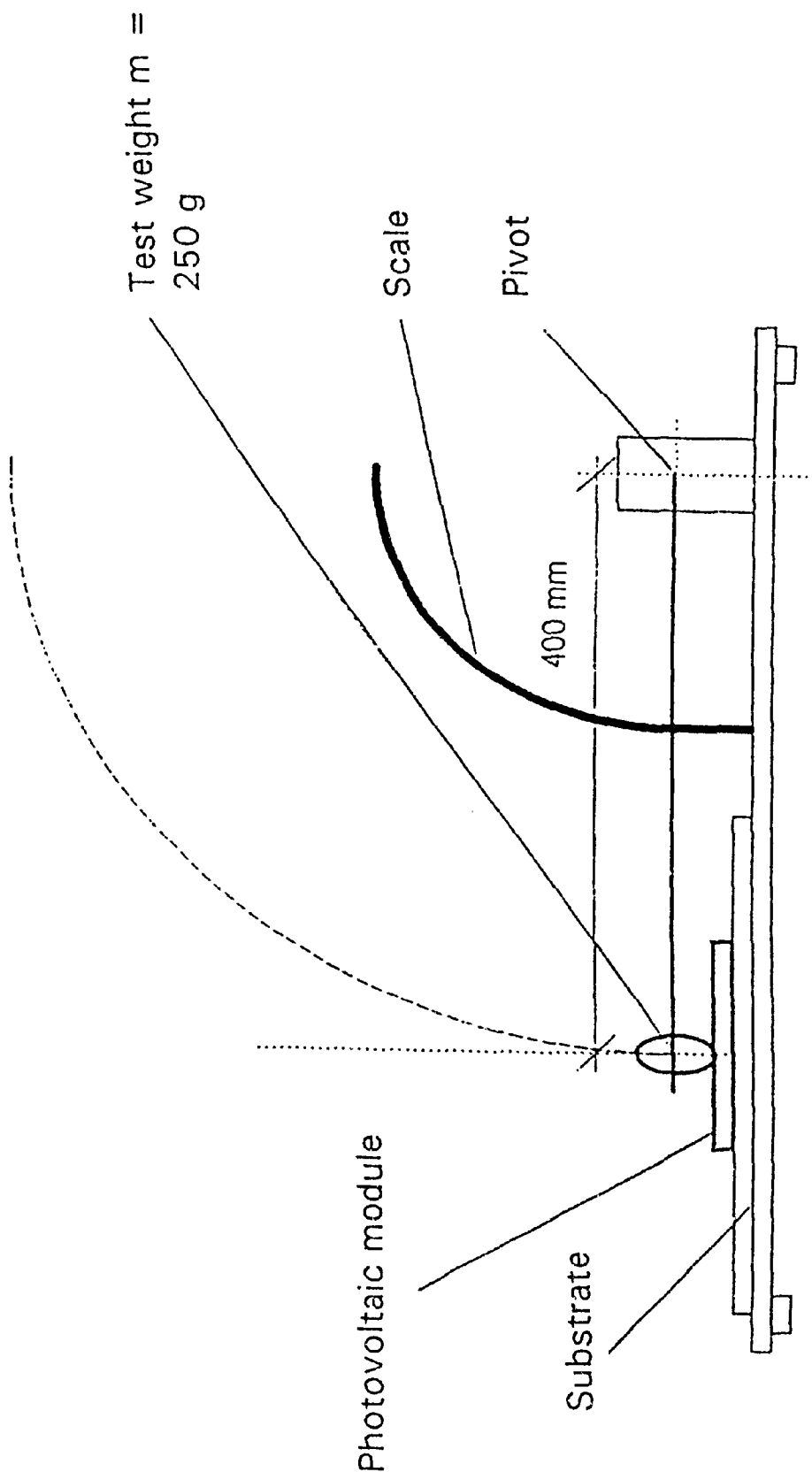
FIG. 1 is a schematic representation of an impact strength test device as described further in the Examples herein.

The photovoltaic modules according to the invention have a number of advantages.

Photovoltaic modules based on polycarbonate/fluorinated polymer composite films have an improved mechanical strength and low weight. The low weight is particularly advantageous for use of the photovoltaic modules according to the invention as mobile sources of electricity. Compared with polycarbonate coverings, they have improved weather resistance and they are more impermeable to water vapour. The scratch resistance is high.

In addition, as a result of increased freedom when designing the structure, the requirement for easy printability of the covering layer or, if required, also deeper lying layers, is satisfied. Furthermore, these types of modules can be subjected to higher temperatures than photovoltaic modules with fluorinated polymer layers, under practical conditions.

Photovoltaic modules according to the invention contain at least one layer consisting of a multilayered composite film which contains at least one layer of polycarbonate and at least one layer of a fluorine-containing polymer. In addition they contain at least one layer consisting of one or more solar cells. The solar cells may be connected in parallel or in series.

Photovoltaic modules according to the invention are preferably built up from several layers, wherein the outermost layer which faces the light consists of a composite film which contains at least one layer of polycarbonate and at least one layer of a fluorine-containing polymer.

The solar cells in the photovoltaic modules according to the invention consist of inorganic and/or organic photosensitive materials, e.g. monocrystalline silicon, polycrystalline silicon or amorphous silicon or copper/indium selenide or cadmium telluride or organic dyestuffs or Graetzel cells. The solar cells are preferably based on silicon.

Polycarbonate/fluorinated polymer composite films according to the invention may consist of two or more layers.

A preferred embodiment of the polycarbonate/fluorinated polymer composite films according to the invention is a two-layered structure consisting of a polycarbonate layer and fluorinated polymer layer. An adhesion-promoting layer may be present between the two layers. In addition further additives such as e.g. UV absorbers may be contained in the layers.

Another preferred embodiment of the polycarbonate/fluorinated polymer composite films according to the invention is a three-layered system consisting of one fluorinated polymer layer, one polycarbonate layer and one ethylene/vinyl acetate copolymer layer. Adhesion-promoting layers may be present between the layers mentioned. In addition further additives such as e.g. UV absorbers may be contained in the layers. This layer structure is particularly advantageous for producing photovoltaic modules according to the invention since the solar cells may be laminated into the ethylene/vinyl acetate copolymer layer without having to use a separate film made of ethylene/vinyl acetate copolymer.

Polycarbonate/fluorinated polymer composite films according to the invention may be prepared by extrusion, coextrusion or lamination. They may be surface finished by plasma deposition e.g. CVD (chemical vapour deposition), sputtering, vaporisation, ion beam supported deposition, lacquering, etc.

Polycarbonate/fluorinated polymer composite films according to the invention may have thicknesses from 5 μm up to 1000 μm. A thickness of 100 μm to 1000 μm is preferred. A thickness of 200 μm to 600 μm is particularly preferred. The ratio by weight of polycarbonate to fluorinated polymer may be from 1000:1 to 1:1000. This ratio is preferably 100:1 to 1:100. A ratio of 20:1 to 1:20 is particularly preferred The polycarbonates used in the polycarbonate/fluorinated polymer composite films are those based on diphenols of the formula (II)

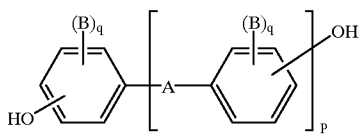

(II)

in which
A represents a single bond, a $C_1$–$C_5$ alkylene, $C_2$–$C_5$ alkylidene or $C_5$–$C_6$ cycloalkylidene group, —S— or —$SO_2$—,
B represents chlorine or bromine,
q is 0, 1 or 2 and
p is 1 or 0,
or alkyl-substituted dihydroxyphenylcycloalkanes of the formula (III)

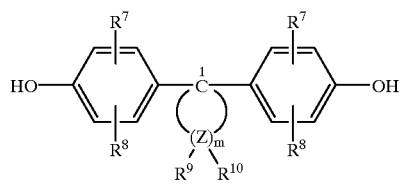

(III)

in which
$R^7$ and $R^8$, independently, each represent hydrogen, halogen, preferably chlorine or bromine, a $C_1$–$C_8$ alkyl, $C_5$–$C_6$ cycloalkyl, $C_6$–$C_{10}$ aryl, preferably phenyl, and $C_7$–$C_{12}$ aralkyl, preferably phenyl-$C_1$–$C_4$ alkyl, in particular benzyl, group,
m is the integer 4, 5, 6 or 7, preferably 4 or 5,
$R^9$ and $R^{10}$ may be selected individually for each Z and, independently, represent hydrogen or a $C_1$–$C_6$ alkyl group,
and
z represents carbon, with the proviso that $R^9$ and $R^{10}$ simultaneously represent an alkyl group on at least one atom Z.

Suitable diphenols of the formula (II) are e.g. hydroquinone, resorcinol, 4,4'-dihydroxydiphenyl, 2,2-bis-(4-hydroxyphenyl)-propane (i.e. bisphenol A), 2,4-bis-(4-hydroxyphenyl)-2-methylbutane, 1,1-bis-(4-hydroxyphenyl)-cyclohexane, 2,2-bis-(3-chloro-4-hydroxyphenyl)-propane, 2,2-bis-(3,5-dibromo-4-hydroxyphenyl)-propane.

Preferred diphenols of the formula (II) are 2,2-bis-(4-hydroxyphenyl)-propane, 2,2-bis-(3,5-dichloro-4-hydroxyphenyl)-propane and 1,-bis-(4-hydroxyphenyl)-cyclo-hexane.

Preferred diphenols of the formula (III) are 1,1-bis-(4-hydroxyphenyl)-3,3-dimethylcyclohexane, 1,1-bis-(4-hydroxyphenyl)-3,3,5-trimethylcyclohexane and 1,1-bis-(4-hydroxyphenyl)-2,4,4-trimethylcyclopentane.

Polycarbonates which are suitable for use according to the invention are either homopolycarbonates or copolycarbonates. A mixture of the previously-defined thermoplastic polycarbonates is also suitable.

The polycarbonates may be prepared in a known manner from diphenols using phosgene in the phase boundary process or using phosgene in a homogeneous phase process, the so-called pyridine process or by the melt transesterification process from diphenols and carbonates, wherein the molecular weight can be adjusted in a known manner by using an appropriate amount of known chain terminators. These methods of preparation are described e.g. in H. Schnell, "Chemistry and Physics of Polycarbonates", Polymer Reviews, Volume 9, pages 31–76, Interscience Publishers, 1964.

Suitable chain terminators are e.g. phenol, p-chlorophenol, p-tert-butylphenol, or 2,4,6-tribromophenol, or else long chain alkylphenols such as 4-(1,1,3,3-tetramethylbutyl)-phenol or a monoalkylphenol or a dialkylphenol with a total of 8 to 20 carbon atoms in the alkyl substituents such as e.g. 3,5-di-tert.-butylphenol, p-iso-octylphenol, p-tert-octylphenol, p-dodecylphenol and 2-(3,5-dimethylheptyl)-phenol and 4-(3,5-dimethylheptyl)-phenol.

The amount of chain terminators used is generally between 0.5 and 10 mol. %, with respect to the sum of the particular diphenols of formula (II) and/or (III) used.

Polycarbonates which are suitable for use according to the invention have average molecular weights ($\overline{M}_w$, weight average, measured e.g. by ultracentrifuging or light-scattering measurements) of 10,000 to 200,000, preferably 18,000 to 80,000.

Polycarbonates which are suitable according to the invention may be branched in a known way, to be precise preferably by incorporating 0.05 to 2 mol. %, with respect to the sum of diphenols used, of trifunctional or more than trifunctional compounds, e.g. those with three or more than three phenolic groups.

Preferred polycarbonates are, in addition to bisphenol A homopolycarbonate, the copolycarbonates of bisphenol A with up to 15 mol. %, with respect to the molar sum of diphenols, of 2,2-bis-(3,5-dibromo-4-hydroxyphenyl)-propane and the copolycarbonates of bisphenol A with up to 60 mol. %, with respect to the molar sum of diphenols, of 1,1-bis-(4-hydroxyphenyl)-3,3,5-trimethylcyclohexane.

The polycarbonates may be partly or entirely replaced by aromatic polyester carbonates. The aromatic polycarbonates may also contain polysiloxane blocks. Their preparation is described for example in U.S. Pat. No. 3,821,325.

The fluorinated polymers used are polymers in which the hydrogen atoms on the carbon chain of polyethylene are replaced entirely or partly by fluorine atoms and also chlorine or fluorine/chlorine derivatives derived therefrom and copolymers derived therefrom.

A preferred embodiment of the photovoltaic modules according to the invention is represented by the following structure. The face turned towards the light consists of a composite film according to the invention. Below that is a solar cell layer embedded into a polymer. The polymer may be e.g. an ethylene/vinyl acetate copolymer, polyurethane or a polysiloxane. An ethylene/vinyl acetate copolymer is preferably used here. Embedding is performed in such a way that the solar cells are laminated in between two ethylene/vinyl acetate copolymer films. Below that is a backing layer made of glass, metal, an epoxide resin mat or a plastic material. At the same time as the solar cells are laminated, the other layers in the photovoltaic module are preferably brought together to form a complete module in one preparation step. The photovoltaic modules may be set into a frame made of metal or other materials. The photovoltaic modules may also be placed directly onto different substrates, e.g. the wing structure of a glider, without using a backing layer.

Another preferred embodiment of photovoltaic modules according to the invention is represented by the following symmetric structure. The face turned towards the light consists of a composite film according to the invention. Below that is a solar cell layer embedded into a polymer. The polymer may be e.g. an ethylene/vinyl acetate copolymer, polyurethane or a polysiloxane. An ethylene/vinyl acetate copolymer is preferably used here. The embedding procedure is preferably performed in such a way that the solar cells are laminated in between two ethylene/vinyl acetate copolymer films. Below that is a second layer of the composite film according to the invention. The photovoltaic modules may be set into a frame made of metal or other materials.

Photovoltaic modules according to the invention may be flat or not flat. They are preferably not flat.

Photovoltaic modules according to the invention may also be a constituent of so-called hybrid modules which are used to produce electricity and heat.

Photovoltaic modules according to the invention may be used for stationary or mobile power production. Photovoltaic modules according to the invention may be used e.g. for solar vehicles, such as e.g. solar automobiles, for aircraft or airships, for ships or boats, for house boats or caravans, for toys, for advertising purposes such as e.g. illuminated billboards, for illuminating timetables, for parking ticket machines, for lighting systems when trekking or in the leisure area, in the area of safety technology, for fascia modules, roof modules or for sound insulating wall modules.

In all the uses mentioned above, the photovoltaic modules according to the invention may either be used to supply the entire energy requirement of the appropriate object, i.e. to supply the energy required e.g. in a solar automobile for movement, or the photovoltaic modules according to the invention may provide only some of the energy requirement of the appropriate object, e.g. illuminating a vehicle.

Preparing photovoltaic modules according to the invention may be achieved e.g. by the embedding process or by the casting process.

A vacuum lamination process using ethylvinyl acetate (EVA) as an adhesive film has proven useful as a basic embedding process. In this process the photovoltaic modules are brought together in a vacuum chamber under the effect of a reduced and/or increased pressure at elevated temperature to give a "laminate". EVA melts during this process and envelopes the solar cells on all sides. After the cross-linking process the solar cells are largely protected against moisture, dirt, etc. The other layers in the photovoltaic module are preferably brought together to form a complete module in one processing step, preferably simultaneously with the lamination of the solar cells into the EVA layer.

As an alternative to this method, for the preparation of modules with a large two-dimensional structure, a casting process has been developed. In this case the solar cells are inserted between two covering layers e.g. polycarbonate/polyvinyl fluoride composite films. The space in between is then filled with a low viscosity polyurethane resin or polysiloxane. This process is also suitable for the preparation of small modules. Optimum integration is enabled if the housing has an appropriate structure.

EXAMPLES

To check the printability, the following tests were performed on the printability of different films:

| Type of film | Adhesive strip test | Cross-hatch value |
|---|---|---|
| Polycarbonate/polyvinyl fluoride composite film (according to the invention); printed on the polycarbonate face | | |
| Silk-screen colour A | no loosening of the colour | 0 |
| Silk-screen colour B | no loosening of the colour | 1 |
| Polyvinyl fluoride film (comparison example) | | |
| Silk-screen colour A | no adhesion of the colour | 5 |
| Silk-screen colour B | no adhesion of the colour | 5 |
| Ethylene/tetrafluoroethylene copolymer film (comparison example) | | |
| Silk-screen colour A | no adhesion of the colour | 5 |
| Silk-screen colour B | no adhesion of the colour | 5 |
| Polyvinyl fluoride/polyethyleneterephthalate/polyvinyl fluoride composite film (comparison example) | | |
| Silk-screen colour A | no adhesion of the colour | 5 |
| Silk-screen colour B | loosening of the colour | 2 |

The films were printed with two different, single-component silk-screen colours:
1. Silk-screen colour A (high temperature colour: Noriphan® HTR, binder copolycarbonate based on bisphenol A and 1,1-bis-(4-hydroxyphenyl)-3,3,5-trimethylcyclohexane (commercial name APEC® HT)),
2. Silk-screen colour B (standard colour: Jet 200, Pröll company, binder polyacrylate resin and cellulose derivatives).

Printing was performed once, over one hundredth of the material. The samples were dried in trays at room temperature. Testing was performed 43 hours after printing.

The cross-hatch test was performed in accordance with DIN 53 151, ISO 2409.

When assessing the results, cross-hatch value 0 is the best assessment. After that there is a grading to cross-hatch value 5 as the poorest assessment. Classification of cross-hatch value 0 to cross-hatch value 5 was performed using comparison charts in accordance with the standard mentioned above.

The adhesive strip test is performed as follows. Cross-hatching is performed and then an adhesive strip 18 mm wide is pressed onto the coloured layer, applied with a rubber roller using moderate pressure and then the adhesive strips are pulled off uniformly at a moderate speed. Assessment takes place in the same way as with the cross-hatch test.

To test the mechanical strength, the following trials were performed:

The layout of the test device can be seen in the drawing "FIG. 1".

The following tests were performed on the photovoltaic modules to assess mechanical strength.

Description of the Test Device:

The test weight with a mass of 250 g is placed on a lever in such a way that it can be rotated. The radius at the underside of the test weight is 20 mm. During the test, the weight is lifted by an amount x and allowed to fall under gravity onto the photovoltaic module being tested.

The substrate is made of a tough material. It can be exchanged and adapted to the conditions used to support the module in practice.

The height of free fall can be read off a graduated scale.

The impact strength is tested by allowing the weight to fall 10 times and then visually assessing the damage and by measuring the electrical characteristics of the module.

Performing the Test and Test Results:

Tests to compare the resistance of the photovoltaic modules (embedded solar cells with different commercially available covering films) were performed with a falling weight with a mass of 250 g.

The falling weight was allowed to fall 10 times from a height A=10 cm, B=20 cm, C=30 cm onto the sample. For this, the sample was moved back 30 mm from the previous impact point for each test.

It was assessed whether the embedded solar cells were broken. In the event of damage, the resulting cell fragments in the ethylene/vinyl acetate copolymer layer shift in such a way that the damage is easily detectable in transmitted light.

The tests gave the following results:

| Covering with polyvinyl fluoride film (Tedlar ®) | A | 3 × in working order |
| --- | --- | --- |
| | | 7 × broken |
| | B | 10 × broken |
| Covering with polycarbonate film | A | 10 × in working order |
| | B | 1 × broken |
| | | 9 × in working order |
| | C | 10 × broken |
| Covering with polycarbonate/polyvinyl fluoride composite film (Makrofol ® EPC) | A | 10 × in working order |
| | B | 10 × in working order |
| | C | 9 × in working order |
| | | 1 × broken |

What is claimed is:

1. A photovoltaic module comprising at least one multilayered composite film which contains: at least one layer of polycarbonate; and at least one layer of fluorine-containing polymer, wherein at least one multilayered composite film is printed.

2. The photovoltaic module of claim 1 wherein the multilayered composite film contains: a polycarbonate layer; a fluorine-containing polymer layer; and optionally an adhesion-promoting layer in between said polycarbonate layer and said fluorine-containing polymer layer.

3. The photovoltaic module of claim 1 wherein the multilayered composite film contains: a fluorine-containing polymer layer; a polycarbonate layer; an ethylene/vinyl acetate copolymer layer; and optionally an adhesion-promoting layer in between each of said fluorine-containing polymer layer, polycarbonate layer and ethylene/vinyl acetate copolymer layer.

4. The photovoltaic module of claim 1 wherein at least one of the polycarbonate layer and the fluorine-containing polymer layer contains a UV absorber.

5. The photovoltaic module of claim 1 wherein one multilayered composite film forms the uppermost layer of the photovoltaic module and faces a light source.

6. The photovoltaic module of claim 1 wherein the polycarbonate is a polycarbonate based on bisphenol A.

7. The photovoltaic module of claim 1 wherein the polycarbonate is a copolycarbonate based on bisphenol A and up to 60 mol. %, with respect to the molar sum of diphenols, of 1,1-bis-(4-hydroxyphenyl)-3,3,5-trimethylcyclohexane.

8. The photovoltaic module of claim 1 wherein the fluorine-containing polymer is polyvinyl fluoride.

9. A stationary or mobile power generator comprising the photovoltaic module of claim 1.

10. The photovoltaic module of claim 1 wherein the ratio by weight of polycarbonate to fluorinated polymer of said multilayered composite film is from 1000:1 to 1:1000.

11. The photovoltaic module of claim 1 wherein the ratio by weight of polycarbonate to fluorinated polymer of said multilayered composite film is from 100:1 to 1:100.

12. The photovoltaic module of claim 1 wherein the ratio by weight of polycarbonate to fluorinated polymer of said multilayered composite film is from 20:1 to 1:20.

13. A composite body comprising: a layer of fluoropolymer; a layer of polycarbonate; a layer of ethylene-vinyl-acetate copolymer; and optionally a bonding agent layer situated between each of said fluoropolymer layer, said polycarbonate layer and said ethylene-vinyl-acetate copolymer layer, wherein each of said fluoropolymer, polycarbonate, ethylene-vinyl-acetate copolymer and optional bonding agent layers optionally contain additives, and said composite body is printed.

14. A photovoltaic module having a multilayered covering comprising at least one layer that contains polycarbonate resin and at least one layer that contains a fluoropolymer, wherein said multilayered covering is printed.

15. The photovoltaic module of claim 14 wherein the module comprises a solar cell.

16. The photovoltaic module of claim 15 wherein the solar cell is embedded in a polymer selected from the group consisting of ethylene-vinyl acetate copolymer, polyurethane and polysiloxane.

* * * * *